(12) United States Patent
Huang et al.

(10) Patent No.: US 8,820,728 B2
(45) Date of Patent: Sep. 2, 2014

(54) SEMICONDUCTOR WAFER CARRIER

(75) Inventors: Jao Sheng Huang, Jiayi (TW); Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 556 days.

(21) Appl. No.: 12/617,851

(22) Filed: Nov. 13, 2009

(65) Prior Publication Data

US 2010/0194014 A1    Aug. 5, 2010

Related U.S. Application Data

(60) Provisional application No. 61/149,206, filed on Feb. 2, 2009.

(51) Int. Cl.
*B23Q 3/00* (2006.01)

(52) U.S. Cl.
USPC .......... 269/289 R; 269/903; 29/281.1; 29/832

(58) Field of Classification Search
USPC .......... 269/21, 289 R, 900, 903; 29/830, 832, 29/852, 281.1
See application file for complete search history.

(56) References Cited

U.S. PATENT DOCUMENTS

| | | | |
|---|---|---|---|
| 4,502,094 A * | 2/1985 | Lewin et al. ................ | 361/234 |
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,342,434 B1 * | 1/2002 | Miyamoto et al. ............ | 438/464 |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,589,855 B2 * | 7/2003 | Miyamoto et al. ............ | 438/464 |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,713,366 B2 * | 3/2004 | Mong et al. ................... | 438/459 |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |

(Continued)

*Primary Examiner* — Lee D Wilson
*Assistant Examiner* — Adam Barlow
(74) *Attorney, Agent, or Firm* — Slater and Matsil, L.L.P.

(57) ABSTRACT

A system and a method for protecting semiconductor wafers is disclosed. A preferred embodiment comprises a carrier with a central region and an exterior region. The exterior region preferably has a thickness that is greater than the central region, to form a cavity in the carrier. An adhesive is preferably placed into the cavity, and a semiconductor wafer is placed onto the adhesive. The edges of the semiconductor wafer are protected by the raised exterior region as well as the displaced adhesive that at least partially fills the area between the semiconductor wafer and the exterior region of the carrier.

19 Claims, 3 Drawing Sheets

(56) References Cited

U.S. PATENT DOCUMENTS

| | | |
|---|---|---|
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,354,649 B2 * | 4/2008 | Dolechek et al. ............. 428/446 |
| 7,355,273 B2 | 4/2008 | Jackson et al. |
| 8,097,955 B2 * | 1/2012 | Zimmermann et al. ....... 257/777 |
| 2002/0048907 A1 * | 4/2002 | Miyamoto et al. ............ 438/464 |
| 2002/0061642 A1 * | 5/2002 | Haji et al. ..................... 438/613 |
| 2007/0139855 A1 * | 6/2007 | Van Mierlo et al. .......... 361/234 |
| 2009/0250855 A1 * | 10/2009 | Fujii et al. ....................... 269/21 |

\* cited by examiner

SEMICONDUCTOR WAFER CARRIER

This application claims the benefit of U.S. Provisional Patent Application Ser. No. 61/149,206, filed on Feb. 2, 2009, and entitled "Semiconductor Wafer Carrier," which application is incorporated herein by reference.

TECHNICAL FIELD

The present invention relates generally to a system and a method for manufacturing semiconductor devices and, more particularly, to a system and method for carrying semiconductor wafers.

BACKGROUND

Generally, semiconductor wafers can be thin and vulnerable to damage, and can become even thinner and more vulnerable to damage during processing. One such step that can make the semiconductor wafer thinner is a through silicon via (TSV) process, whereby conductive vias are formed in a front side of the wafer and the backside of the wafer is thinned through a process such as grinding in order to expose the conductive vias from the backside. This process of thinning the wafer can damage the edges of the wafer and can make the wafer even more fragile and susceptible to damage during subsequent transportation and processing of the wafer.

To help alleviate these types of damage, a carrier is normally attached to the wafer. This carrier is attached using an adhesive, and is intended to allow handling of the wafer by handling the carrier. Additionally, the added strength of the carrier supports the wafer so that stresses caused by transportation and/or processing will not damage the wafer. Typically the carrier is manufactured in the same size and shape as the wafer with a flat surface to which the wafer is attached.

However, by attaching the wafer to a carrier that is the same size and shape as the wafer, the wafer is still vulnerable to damage during processing and transportation. Specifically, the exposed outside edges of the wafer can become cracked and damaged during transportation and processing. This damage can lower the overall process yield, as certain dies on the wafer may become damaged and inoperable.

SUMMARY OF THE INVENTION

These and other problems are generally solved or circumvented, and technical advantages are generally achieved, by preferred embodiments of the present invention which provide for a semiconductor wafer carrier that protects the sides of the semiconductor wafer.

In accordance with a preferred embodiment of the present invention, a semiconductor wafer comprises a substrate with a raised exterior region. A cavity is located in a central region of the substrate. The cavity is configured to be connected to a semiconductor wafer with an adhesive.

In accordance with another preferred embodiment of the present invention, a method for protecting semiconductor wafers comprises providing a carrier with a cavity formed therein. An adhesive is provided within the cavity, and a semiconductor wafer is placed at least partially within the cavity.

In accordance with yet another preferred embodiment, a method for protecting a semiconductor wafer comprises providing a carrier that comprises a first region with a first thickness and a second region with a second thickness greater than the first thickness, the second region located along an outer edge of the first region. A semiconductor wafer is attached to the first region of the carrier using an adhesive.

An advantage of a preferred embodiment of the present invention is the protection of a semiconductor wafer from the damages associated with transportation and processing of the semiconductor wafer.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a process of attaching a semiconductor wafer to a carrier during a thinning process to expose through silicon vias (TSV). The invention may also be applied, however, to other processes in which it may be beneficial to utilize a carrier substrate.

Figure 1:
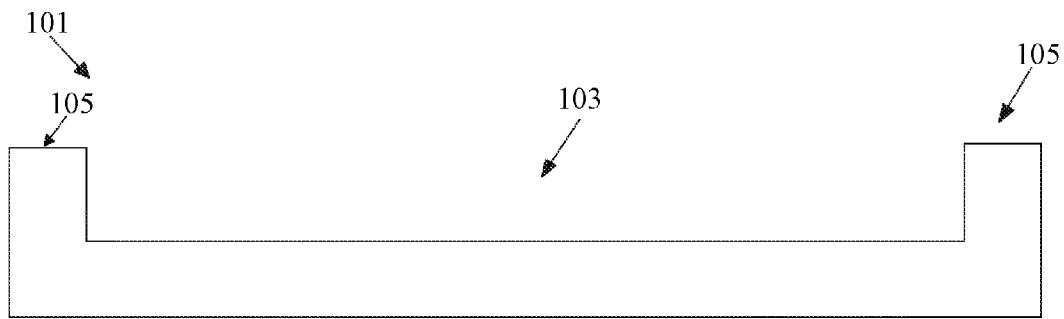
FIG. 1 illustrates a cross-sectional of a carrier with a central section and an exterior section in accordance with an embodiment of the present invention.

With reference now to FIG. 1, there is shown a cross-sectional view of a preferred carrier 101. The carrier 101 preferably comprises, for example, glass, silicon oxide, aluminum oxide, combinations of these, or the like. The carrier 101 preferably has a central region 103 and an exterior region 105. The central region 103 will preferably be attached to a wafer 401 (described below with respect to FIG. 4) while the exterior region 105 protects the edges of the wafer 401 from damage during processing and transportation.

The central region 103 is preferably planar in order to accommodate its attachment to the wafer 401. The central region 103 preferably has a thickness of between about 550 µm and about 670 µm, with a preferred thickness of about 620 µm. Additionally, the central region 103 preferably has a diameter that is greater than the wafer 401 (see FIG. 4) to which it will be attached. Accordingly, while the size of the central region 103 will be in some ways dependent upon the size of the wafer 401, the central region 103 preferably has a diameter that is between about 1.5% and about 0.5% greater than the diameter of the wafer 401. For example, if the wafer 401 is about 300 mm in diameter, the central region 103 would preferably be about 303 mm in diameter.

The exterior region 105 (shown in cross section as two separate sections on the sides of the central region 103), while attached to the central region 103, preferably surrounds the central region 103 and preferably also has a greater thickness than the central region 103. Accordingly, the exterior region 105 preferably extends above the preferred planar surface of the central region 103. This extension, or step height, of the exterior region 105 forms a cavity for the central region 103 in which the wafer 401 can rest for further processing. As such, the exact dimensions of the step height are dependent at least in part on the dimensions of the wafer 401 to be attached. However, as an example, for a wafer about 100 µm in thickness, the step height between the exterior region 105 and the central region 103 is preferably less than about 100 µm, with a preferred step height of about 50 µm.

The carrier 101 is preferably formed using a masking and etching process. In this process a carrier in the shape of a cylinder may be segmented from either a sheet or a cylinder of the desired material. Then, if the preferred glass material is utilized for the carrier, a suitable masking process utilizing photoresistive materials may be used to form a photoresist to selectively expose the central region 103 while protecting the exterior region 105. Then, with the exterior region 105 protected, a suitable etchant may be used to thin the exposed central region 103 while maintaining the thickness of the exterior region 105.

However, as one of skill in the art will recognize, the masking and etching process described above is merely one example of a method in which the preferred embodiment of the carrier 101 may be formed. Other methods, such as forming the central region 103 and the exterior region 105 to their desired thicknesses separately, and then attaching the central region 103 to the exterior region 105 by raising the parts to their melting points, may alternatively be utilized. Any suitable method of formation may be used for the carrier 101, and all of these methods are intended to be included within the scope of the present invention.

Figure 2:
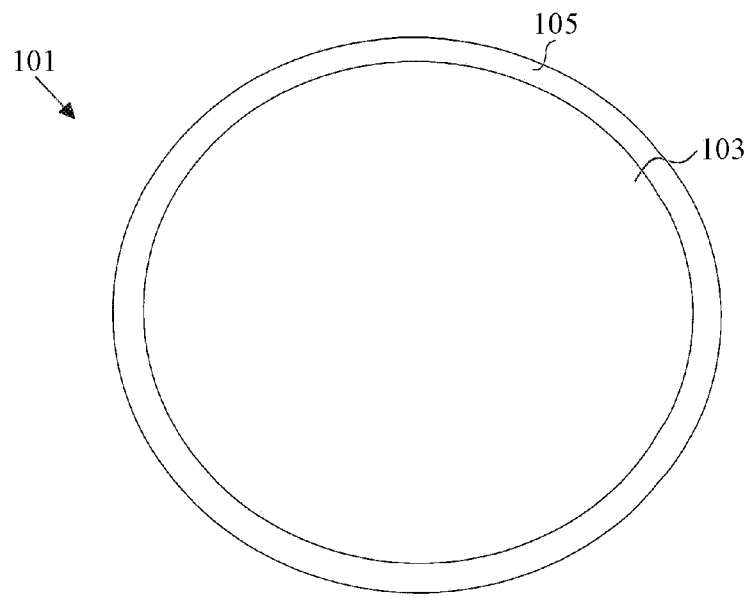
FIG. 2 illustrates a planar view of a carrier with a central section and an exterior section in accordance with an embodiment of the present invention.

FIG. 2B illustrates a plan view of the carrier 101. As illustrated, the central region 103 matches the overall shape of the wafer 401, e.g., circular in shape. FIG. 2B also illustrates the exterior region 105 surrounding the central region 103 along the outer edge of the central region 103.

Figure 3:
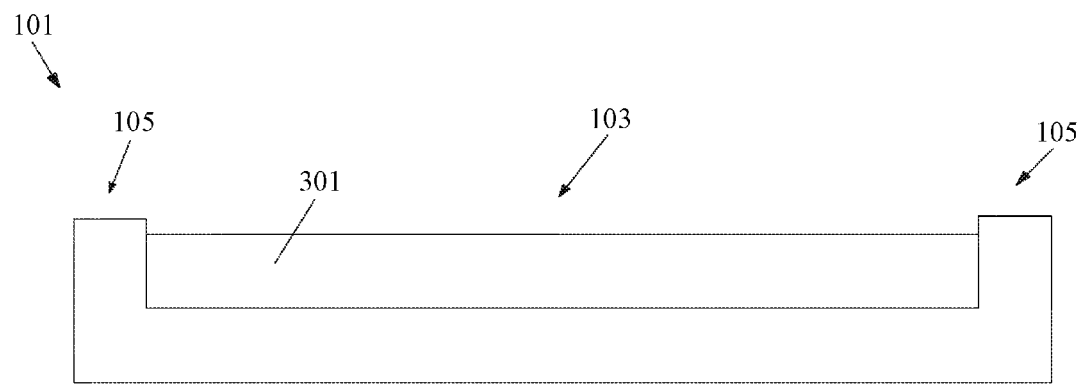
FIG. 3 illustrates the placement of an adhesive onto the carrier in accordance with an embodiment of the present invention.

FIG. 3 illustrates the placement of an adhesive 301 into the cavity of the carrier 101 on the central region 103. The adhesive 301 preferably comprises an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive is preferably placed onto the central section in a liquid, semi-liquid, or gel form, which is readily deformable under pressure.

Figure 4:
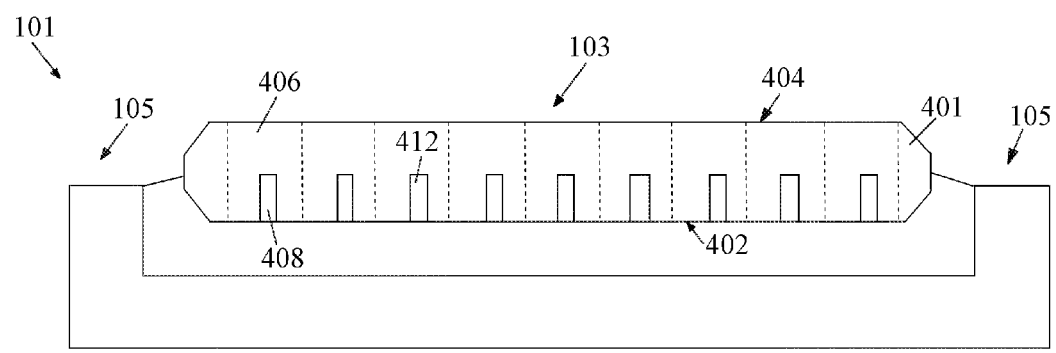
FIG. 4 illustrates the placement of a wafer into contact with the adhesive in accordance with an embodiment of the present invention.

FIG. 4 illustrates the preferable placement of a wafer 401 at least partially into the cavity such that the adhesive 301 will attach the wafer 401 to the carrier 101. The wafer 401 generally comprises a plurality of individual dies referred to generally by reference numeral 406, wherein each die 406 includes a substrate having electronic devices formed thereon as is known in the art. The substrate is typically covered with one or more dielectric layers and conductive layers. The conductive layers provide connectivity and routing for the underlying electronic devices.

The wafer 401 preferably has a first side 402 upon which the electronic devices and dielectric and metal layers are located. The wafer 401 also preferably has a second side 404 located opposite the first side 402 and the electronic devices. The second side 404 preferably has no electronic devices located thereon.

One or more of the individual dies 406 preferably has a conductive via 408 formed partially through the semiconductor wafer 401. The conductive vias 408 are preferably formed by applying and developing a suitable photoresist (not shown), and then etching the first side 402 of the wafer 401 to form via openings. Preferably, the via openings are formed so as to extend into the wafer 401 at least further than the electrical devices formed within and on the wafer 401, and preferably at least to a depth greater than the eventual desired height of the dies 406. Accordingly, while the depth of the via openings from the surface of the wafer 401 is dependent upon the overall design of the dies 406, the depth is preferably between about 70 µm and about 190 µm, with a preferred depth of about 150 µm. Further, the via openings preferably have a diameter of between about 20 µm and about 70 µm, with a preferred diameter of about 50 µm.

A barrier layer (not shown) is preferably formed along the sidewalls of the via openings. The barrier layer preferably comprises a conductive material such as titanium nitride, although other materials, such as tantalum nitride or titanium, may alternatively be utilized. The barrier layer is preferably formed using a CVD process, such as PECVD. However, other alternative processes, such as sputtering or metal organic chemical vapor deposition (MOCVD), may alternatively be used.

The via openings are then filled with a conductive material 412 to form the conductive vias 408. The conductive material 412 is preferably formed through an electrodeposition process and preferably comprises copper. However, other suitable methods, such as electroless deposition, plating, or CVD, and other suitable materials, such as tungsten, may alternatively be used to form the conductive material. Preferably, the conductive material 412 completely fills and overfills the vias openings, and excess conductive material 412 outside of the via openings is then preferably removed through a process such as grinding or etching in order to form the conductive vias 408 that will eventually be formed into the TSVs (described below with respect to FIG. 5).

Preferably, the wafer 401 is placed into the cavity such that the first side 402 of the wafer 401 faces the central region 103 of the carrier 101, and preferably comes into contact with the adhesive 301. Additionally, the wafer 401 is preferably placed only partially into the cavity. Such a placement of the wafer 401 only partially into the cavity allows the second side 404 of the wafer 401 to remain above the exterior region 105 of the carrier 101, thereby allowing further processing (such as described below with respect to FIG. 5), to be performed on the second side 404 of the wafer 401 while the first side 402 of the wafer 401 remains protected by the carrier 101.

Preferably, the wafer 401 is placed into the cavity such that the wafer 401 does not directly contact the exterior region 105 of the carrier 101, thereby keeping the wafer 401 from direct contact with anything except the adhesive 301. Further, the placement of the wafer 401 into the cavity preferably displaces at least a portion of the adhesive 301 into the area between the wafer 401 and the exterior region 105 of the carrier 101. As such, the adhesive 301 will directly contact and protect at least a portion of the sides of the wafer 401 while also protecting the junction between the sidewalls of the wafer 401 and the first side 402 of the wafer 401.

This displacement of the adhesive 301 preferably not only serves to attach the wafer 401 to both the central region 103 and the exterior region 105 of the carrier 101 (thereby giving better support to the wafer 401), it also serves to directly cover and protect at least a portion of the sidewalls and corners of the wafer 401. Accordingly, this direct covering protects at least some of the sidewalls and corners of the wafer 401 from transportation and processing damage while also serving to supply better support to the wafer 401 as a whole. Accordingly, transportation and processing damage done to the wafer 401 can be reduced or eliminated while the wafer 401 is attached to the carrier 101.

Additionally, the wafer 401 is preferably placed into the cavity so as not to cause stresses which may damage the wafer 401 during placement. As such, the wafer 401 is preferably placed into contact with the adhesive 301 by evenly lowering the semiconductor wafer onto the adhesive 301, such that one portion of the first side 402 of the wafer 401 does not contact the adhesive 301 prior to other portions of the first side 402 of the wafer 401. This placement prevents undesired stresses from building up unevenly within the wafer 401 prior to attachment to the carrier 101.

Once the wafer 401 has been at least partially placed into the cavity, a curing process is preferably performed in order to cure the adhesive 301, if a curable adhesive is chosen as the preferred adhesive 301. The curing process is preferably performed using a thermal curing process preferably at a temperature of between an ambient temperature and about 250° C., for a time of less than about 30 min.

However, it should be noted that the exact curing process used is dependent at least in part upon the particular adhesive chosen. For example, different adhesives would require different curing conditions, and a pressure sensitive adhesive may not require a curing process at all. Accordingly, any curing process that may be suitable to finalize the attachment of the wafer 401 to the carrier 101, including no cure processes at all, are intended to be included within the scope of the present invention.

Figure 5:
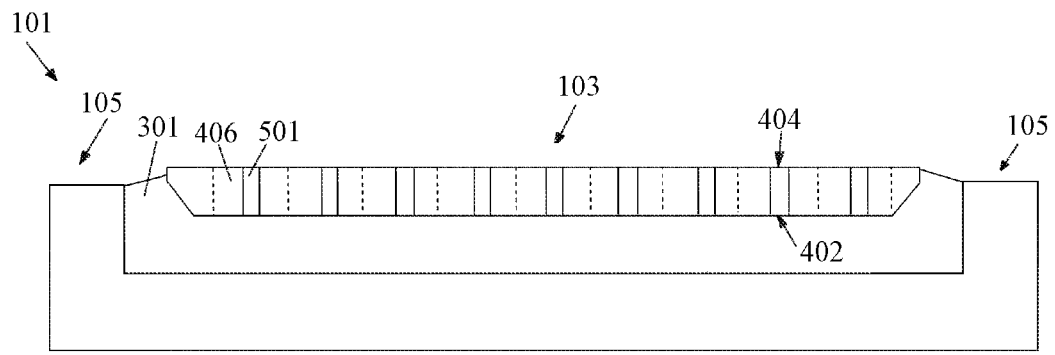
FIG. 5 illustrates the further processing of the wafer while being protected by the carrier in accordance with an embodiment of the present invention.

FIG. 5 illustrates that, preferably after the adhesive 301 has been cured, the second side 404 of the wafer 401 can be further processed while the first side 402 of the wafer 401 is protected. In a preferred embodiment in which TSVs are being formed through the wafer 401, the second side 404 of the wafer 401 is preferably thinned so as to expose the conductive vias 408, thereby forming TSVs 501. The thinning of the wafer 401 is preferably performed using a removal process such as chemical mechanical polishing (CMP), wherein a combination of etchant and abrasive are put into contact with the wafer 401 and a grinding pad (not shown) is used to thin the wafer 401. However, any suitable process for thinning the wafer 401, such as etching, may alternatively be used.

Figure 6:
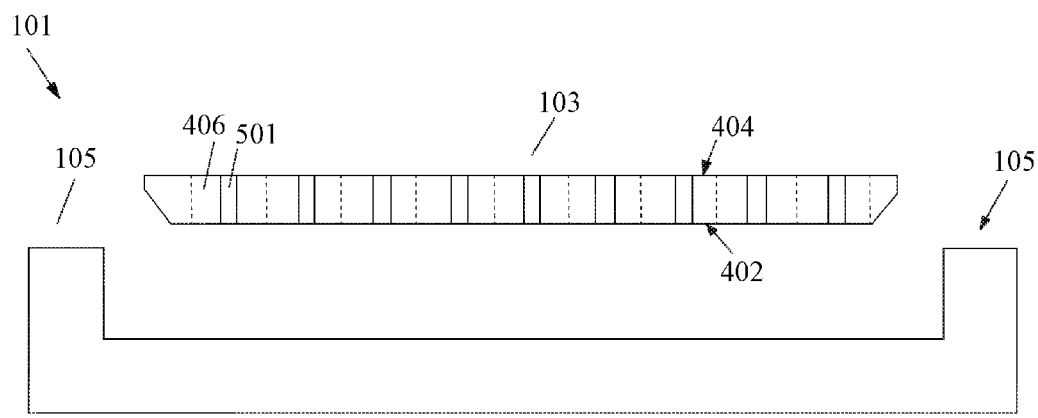
FIG. 6 illustrates the removal of the wafer from the carrier in accordance with an embodiment of the present invention.

FIG. 6 illustrates the removal of the wafer 401 from the carrier 101 after the protection offered by the carrier 101 is no longer desired. In a preferred embodiment in which an ultraviolet glue is utilized as the adhesive 301, the adhesive 301 is preferably irradiated with ultra-violet radiation until it loses some or all of its adhesiveness. Accordingly, without the adhesive 301, the wafer 401 can easily be separated from the carrier 101.

However, as one of ordinary skill in the art will recognize, while the ultra-violet irradiation technique discussed above is preferred when the adhesive 301 is an ultra-violet glue, other types of adhesive 301 may require other methods to debond the wafer 401 from the carrier 101. For example, a thermal debonding process or a laser debonding process may be utilized, depending upon the precise adhesive 301 chosen. Any and all suitable debonding processes may be used to separate the wafer 401 from the carrier 101, and all of these methods are fully intended to be included within the scope of the present invention.

Although the present invention and its advantages have been described in detail, it should be understood that various changes, substitutions and alterations can be made herein without departing from the spirit and scope of the invention as defined by the appended claims. For example, it will be readily understood by those skilled in the art that the type of adhesive may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for protecting semiconductor wafers, the method comprising:
   receiving a carrier, the carrier formed by removing a central portion of a material to form a cavity therein;
   providing an adhesive within the cavity; and
   placing a semiconductor wafer at least partially within the cavity, wherein a portion of the adhesive protects a sidewall of the semiconductor wafer; and
   grinding the semiconductor wafer to expose conductive vias within the semiconductor wafer.

2. The method of claim 1, wherein the cavity extends from a top of the carrier between about 200 µm and about 300 µm.

3. The method of claim 1, wherein the placing a semiconductor wafer displaces the adhesive such that the adhesive and the semiconductor wafer completely fill the cavity.

4. The method of claim 1, wherein the semiconductor wafer at least partially extends away from the cavity.

5. The method of claim 1, wherein the semiconductor wafer further comprises a first side facing the carrier and a second side opposite the first side, wherein the conductive vias extend from the first side towards the second side.

6. The method of claim 1, wherein the adhesive has a thickness of about 100 µm.

7. The method of claim 1, wherein the adhesive is an ultra-violet glue.

8. A method for protecting semiconductor wafers, the method comprising:
   providing a carrier, the carrier comprising:
     a first region with a first thickness; and
     a second region with a second thickness greater than the first thickness, wherein the providing the carrier further comprises receiving the carrier with the first region attached to the second region; and
   attaching a semiconductor wafer to the first region using an adhesive, wherein the attaching the semiconductor wafer displaces at least a portion of the adhesive into a third region between a sidewall of the semiconductor wafer and the second region; and chemically mechanically polishing the semiconductor wafer after the attaching the semiconductor wafer to the first region, the chemically mechanically polishing forming a through-substrate via in the semiconductor wafer, wherein the chemically mechanically polishing forms a planar surface.

9. The method of claim 8, further comprising displacing the adhesive such that the adhesive and the semiconductor wafer completely fill a cavity formed by the first region and the second region.

10. The method of claim 8, wherein the chemically mechanically polishing exposes conductive vias located within the semiconductor wafer.

11. The method of claim 8, further comprising:
processing a side of the semiconductor wafer facing away from the carrier; and
removing the semiconductor wafer from the carrier after the semiconductor wafer has been processed.

12. The method of claim 8, further comprising irradiating the adhesive with ultra-violet radiation.

13. The method of claim 8, wherein the placing a semiconductor wafer into contact with the adhesive is performed by evenly lowering the semiconductor wafer onto the adhesive.

14. A method of manufacturing semiconductor devices, the method comprising:
receiving a carrier manufactured by etching a central region of a material to form a depression;
placing an adhesive onto the carrier; and
placing a semiconductor wafer into the depression and in contact with the adhesive but not in contact with any part of the carrier; and
exposing conductive vias within the semiconductor wafer with a grinding process after the placing the semiconductor wafer into the depression, wherein the grinding process planarizes a first side of the semiconductor wafer.

15. The method of claim 14, wherein the placing the semiconductor wafer displaces a portion of the adhesive along a sidewall of the depression.

16. The method of claim 15, wherein the placing the semiconductor wafer displaces a portion of the adhesive to completely fill a space between the carrier and the semiconductor wafer.

17. The method of claim 14, further comprising forming the conductive vias at least partway through the semiconductor wafer prior to the placing the semiconductor wafer into the depression.

18. The method of claim 14, further comprising irradiating the adhesive with ultra-violet radiation.

19. The method of claim 14, wherein the semiconductor wafer extends above a top surface of the carrier after the placing the semiconductor wafer into the depression.

* * * * *

UNITED STATES PATENT AND TRADEMARK OFFICE
CERTIFICATE OF CORRECTION

| | |
|---|---|
| PATENT NO. | : 8,820,728 B2 |
| APPLICATION NO. | : 12/617851 |
| DATED | : September 2, 2014 |
| INVENTOR(S) | : Huang et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 683 days.

Signed and Sealed this
First Day of September, 2015

Michelle K. Lee
*Director of the United States Patent and Trademark Office*